(12) United States Patent
Kodama

(10) Patent No.: US 9,481,185 B2
(45) Date of Patent: Nov. 1, 2016

(54) PRINTING APPARATUS AND PRINTING METHOD

(71) Applicant: FUJIFILM Corporation, Tokyo (JP)

(72) Inventor: Kenichi Kodama, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/853,209

(22) Filed: Sep. 14, 2015

(65) Prior Publication Data
US 2016/0001577 A1    Jan. 7, 2016

Related U.S. Application Data

(63) Continuation of application No. PCT/JP2014/056288, filed on Mar. 11, 2014.

(30) Foreign Application Priority Data

Mar. 26, 2013 (JP) ................................ 2013-064498

(51) Int. Cl.
*B41J 11/00* (2006.01)
*B41J 2/01* (2006.01)
(Continued)

(52) U.S. Cl.
CPC ............... *B41J 11/002* (2013.01); *B41F 3/36* (2013.01); *B41F 9/06* (2013.01); *B41F 23/04* (2013.01); *B41J 2/0057* (2013.01); *B41J 2/01* (2013.01); *B41M 1/10* (2013.01); *H05K 3/1275* (2013.01)

(58) Field of Classification Search
CPC ........ B41J 11/002; B41J 2/0057; B41J 2/01; H05K 3/1275; B41F 3/36; B41F 23/04; B41F 9/06; B41M 1/10
See application file for complete search history.

(56) References Cited

U.S. PATENT DOCUMENTS 2,193,089 A * 3/1940 Crafts ................... B41F 31/07
101/157
2,659,305 A * 11/1953 Giori ..................... B41F 11/00
101/152
(Continued)

FOREIGN PATENT DOCUMENTS

GB   607341 A    8/1948
GB   846348 A *  8/1960  .............. B41F 9/008
(Continued)

OTHER PUBLICATIONS

The extended European search report issued by the European Patent Office on Aug. 2, 2016, which corresponds to European Patent Application No. 14772951.1-1704 and is related to U.S. Appl. No. 14/853,209.
(Continued)

*Primary Examiner* — Justin Seo
(74) *Attorney, Agent, or Firm* — Studebaker & Brackett PC

(57) ABSTRACT

A printing apparatus includes: a printing plate having a recessed portion formed therein shaped corresponding to a pattern to be formed on a substrate; an inking unit including an inkjet head that performs an inking process of ejecting a liquid into the recessed portion, the liquid having particles as a material of the pattern dispersed therein; a laminating unit that performs a laminating process of laminating the substrate on a surface having the recessed portion formed therein after the inking process; a post-drying unit that performs a drying process on the liquid inside the recessed portion in a state in which the substrate is laminated on the surface having the recessed portion formed therein, thereby to reduce the fluidity of the liquid; and a peeling unit that peels off the substrate from the printing plate after the drying process by the post-drying unit.

15 Claims, 9 Drawing Sheets

(51) Int. Cl.
  *B41M 1/10*   (2006.01)
  *B41F 3/36*   (2006.01)
  *B41F 9/06*   (2006.01)
  *B41F 23/04*  (2006.01)
  *B41J 2/005*  (2006.01)
  *H05K 3/12*   (2006.01)

(56) References Cited

U.S. PATENT DOCUMENTS

| | | | | |
|---|---|---|---|---|
| 4,942,813 | A * | 7/1990 | Arai | B41F 11/00 |
| | | | | 101/152 |
| 5,810,927 | A * | 9/1998 | Ayres | B41F 31/002 |
| | | | | 101/335 |
| 5,888,625 | A * | 3/1999 | Kobayashi | B41M 5/529 |
| | | | | 427/195 |
| 6,045,904 | A * | 4/2000 | Torikoshi | B41M 5/529 |
| | | | | 156/240 |
| 2001/0014058 | A1 | 8/2001 | Ando et al. | |
| 2004/0060646 | A1* | 4/2004 | Hashimoto | H05K 3/207 |
| | | | | 156/230 |
| 2004/0126503 | A1* | 7/2004 | Kuntz | B41M 3/003 |
| | | | | 427/555 |
| 2007/0207925 | A1* | 9/2007 | Benkhoff | B41M 5/30 |
| | | | | 503/201 |
| 2007/0289463 | A1* | 12/2007 | Kusaka | B41F 9/002 |
| | | | | 101/232 |
| 2008/0016686 | A1* | 1/2008 | Lee | H05K 3/0014 |
| | | | | 29/846 |
| 2008/0295724 | A1* | 12/2008 | Lohweg | B41F 33/0009 |
| | | | | 101/484 |
| 2010/0139511 | A1* | 6/2010 | Schaede | B41F 9/002 |
| | | | | 101/156 |
| 2014/0182465 | A1* | 7/2014 | Kamoda | B41F 9/00 |
| | | | | 101/153 |
| 2015/0135977 | A1* | 5/2015 | Kersten | B41F 13/0008 |
| | | | | 101/153 |
| 2015/0258777 | A1* | 9/2015 | Schwitzky | B41F 33/0072 |
| | | | | 101/153 |
| 2016/0185100 | A1* | 6/2016 | Chassot | B41F 33/0045 |
| | | | | 428/195.1 |

FOREIGN PATENT DOCUMENTS

| | | |
|---|---|---|
| JP | 2005-081726 A | 3/2005 |
| JP | 2005-115000 A | 4/2005 |
| JP | 2010-201906 A | 9/2010 |
| WO | 2011/055683 A1 | 5/2011 |

OTHER PUBLICATIONS

International Search Report for PCT/JP2014/056288 dated Apr. 15, 2014.
Written Opinion for PCT/JP2014/056288 dated Apr. 15, 2014.

* cited by examiner (a)

(b)

PRINTING APPARATUS AND PRINTING METHOD

CROSS-REFERENCE TO RELATED APPLICATIONS

This application is a Continuation of PCT International Application No. PCT/JP2014/056288 filed on Mar. 11, 2014, which claims priority under 35 U.S.C §119(a) to Japanese Patent Application No. 2013-064498 filed on Mar. 26, 2013. Each of the above applications is hereby expressly incorporated by reference, in their entirety, into the present application.

BACKGROUND OF THE INVENTION

1. Field of the Invention

The present invention relates to a printing apparatus and a printing method, and more particularly to an inking technique for intaglio plate printing to which an inkjet system is applied.

2. Description of the Related Art

Recent years have seen a use of a technique for forming a micropattern such as metal wiring and electrical wiring patterns for a thin film transistor in a glass substrate, a resin substrate, and other substrates using a printing process. Such a substrate having a micropattern formed by a liquid containing conductive particles such as metal is used for a thin display device such as a liquid crystal display, a portable communication device, and other devices.

Japanese Patent Application Laid-Open No. 2005-081726 (PTL 1) discloses a pattern forming apparatus that forms a color filter for a liquid display and a silver electrode for a plasma display by applying a printing process using a flexible metal flat plate-shaped intaglio plate. The pattern forming apparatus disclosed in PTL 1 fills an intaglio plate with ink (inking) by an inkjet system, evaporates a solvent of the ink filled in the intaglio plate, aligns the intaglio plate with a printing substrate so as to be in close contact with each other, and then transfers the ink onto the printing substrate by pressing the intaglio plate.

Japanese Patent Application Laid-Open No. 2010-201906 (PTL 2) discloses a printing method of filling the substrate with ink to 100% by filling the intaglio plate with ink, removing the ink on a planar portion of the intaglio plate, and evaporating the ink inside a recessed portion thereby to make the ink adhesive and cohesive.

SUMMARY OF THE INVENTION

However, the pattern forming apparatus disclosed in PTL 1 evaporates the solvent of the ink filled in the intaglio plate, but prevents the ink from losing viscosity.

Thus, when the ink is transferred from the intaglio plate to the printing substrate, the ink has viscosity (liquidity), which causes the ink to flow after the intaglio plate is peeled off from the printing substrate, resulting in that it is difficult for the ink to maintain the shape of the intaglio plate.

The printing method disclosed in PTL 2 is configured to apply ink to the entire surface of the intaglio plate and remove unnecessary ink by a blade or the like, resulting in that it is difficult to reduce the consumption of ink. In addition, it is difficult to achieve a balance between preventing scumming (ink remaining on a planar portion) and ensuring reproducibility of the micropattern.

For example, assuming the case where unnecessary ink is removed from the intaglio plate by a blade or the like in order to prevent scumming, if the pressing force against the intaglio plate by the blade or the like is increased, the ink may be removed even from the recessed portion, which causes a problem with reproducibility of the micropattern. Meanwhile, if the pressing force against the intaglio plate is reduced by giving priority to the reproducibility of the micropattern, scumming may occur.

Further, since the intaglio plate is made of silicone rubber, when unnecessary ink is removed from the planar portion of the intaglio plate, the intaglio plate is worn, which causes a problem with durability. In addition, there is still another problem with pattern dependence that occurs when the ink is removed, resulting in that it is difficult to form any pattern.

More specifically, in the case of a long straight line shaped pattern extending in a direction perpendicular to a longitudinal direction of the blade, when the ink is removed from the intaglio plate by a blade or the like, a cutting edge of the blade is slightly entered into the recessed portion of the intaglio plate, which may cause the ink to be removed from the recessed portion. Therefore, it is difficult to form a long straight line shaped pattern extending in a direction perpendicular to a longitudinal direction of the blade with good accuracy, which may restrict the pattern formation.

In view of such circumstances, the present invention has been made, and an object of the present invention is to provide a printing apparatus and a printing method capable of forming a preferable micropattern by a printing process using an intaglio plate.

In order to achieve the above object, a printing apparatus according to the present invention includes: a printing plate having a recessed portion formed therein shaped corresponding to a pattern to be formed on a substrate; an inking unit including an inkjet head that performs an inking process of ejecting a liquid into the recessed portion of the printing plate, the liquid having particles as a material of the pattern dispersed therein; a laminating unit that performs a laminating process of laminating the substrate on a surface having the recessed portion of the printing plate formed therein in a state in which the liquid is placed inside the recessed portion of the printing plate; a drying unit that performs a drying process on the liquid inside the recessed portion in a state in which the substrate is laminated on the surface having the recessed portion of the printing plate formed therein, thereby to reduce fluidity of the liquid; and a peeling unit that peels off the substrate from the printing plate following the drying process by the drying unit.

According to the present invention, a liquid is placed inside a recessed portion of a printing plate by an inking unit, the printing plate is laminated on a substrate, a drying process is performed in a state in which the printing plate is laminated on the substrate to reduce fluidity of the liquid to a degree at which the shape of the liquid inside the recessed portion of the printing plate is maintained, the fluidity of the liquid on the substrate is suppressed after the printing plate is peeled off from the substrate, and thus the shape of the liquid on the substrate corresponding to the shape of the recessed portion of the printing plate is maintained.

Therefore, the present invention can achieve a balance between preventing scumming of the printing plate (residual liquid remaining on the planar portion thereof) and ensuring reproducibility of the micropattern formed on the substrate.

DETAILED DESCRIPTION OF EXEMPLARY EMBODIMENTS

Hereinafter, preferable embodiments of the present invention will be described in detail with reference to the accompanying drawings.

[Entire Configuration]

Figure 1:
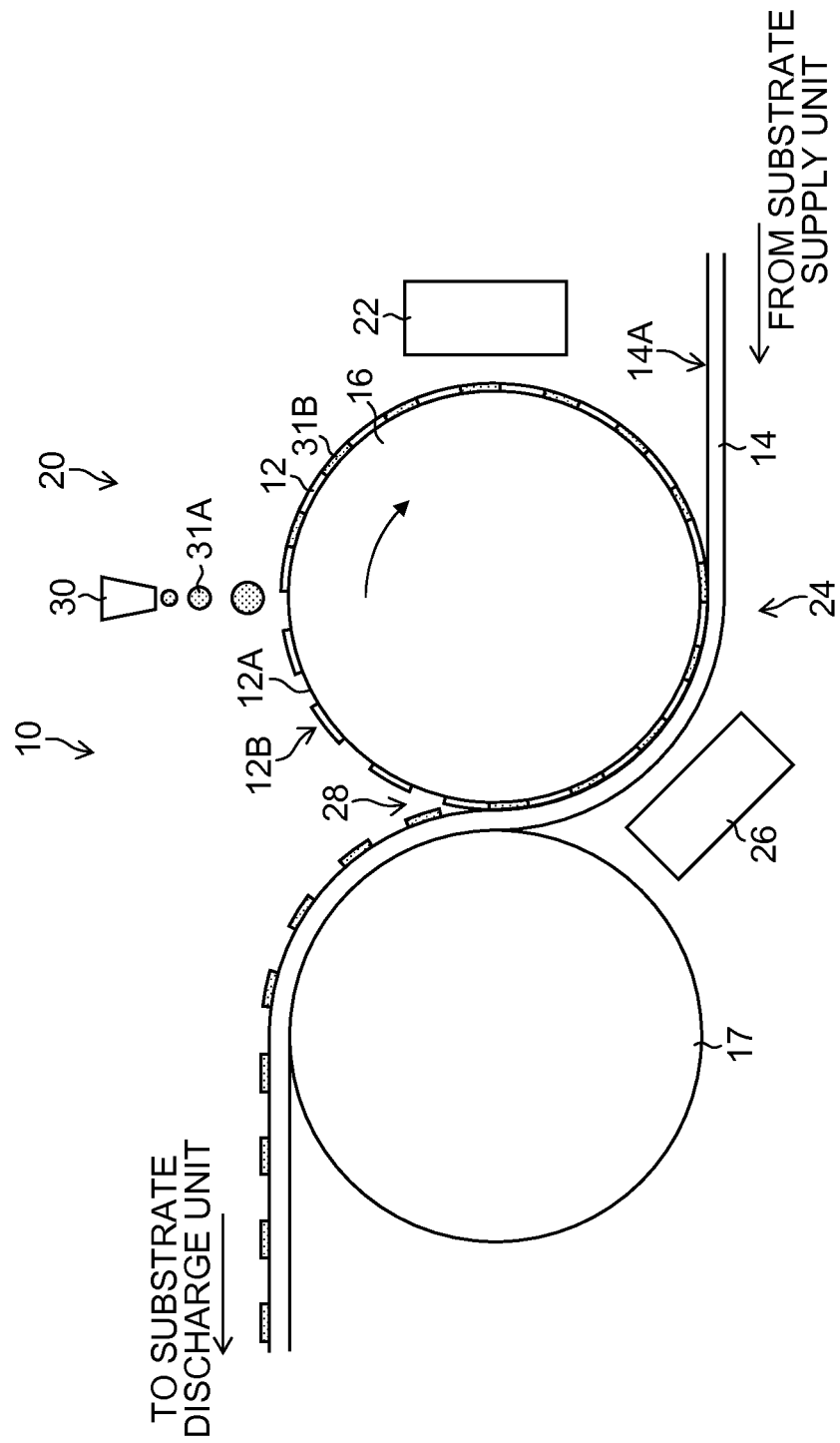
FIG. 1 is an entire configuration view illustrating a schematic configuration of a printing apparatus according to an embodiment of the present invention.

FIG. 1 is an entire configuration view illustrating a schematic configuration of a printing apparatus according to an embodiment of the present invention. FIG. 1 illustrates a printing apparatus 10 which is applied particularly to printed electronics technology. The printing apparatus 10 uses a printing plate (intaglio plate) 12 having a fine pattern portion (recessed portion) 12A formed therein to transfer (form) a pattern from the printing plate 12 to a substrate (base material) 14 serving as a printing substrate.

The printing apparatus 10 is configured to include: an inking unit 20 that places ink into (performs an inking process on) the recessed portion 12A of the printing plate 12; a pre-drying unit 22 that performs a drying process on the printing plate 12 following the inking process; a laminating unit 24 that laminates the substrate 14 on the printing plate 12 following the pre-drying process; a post-drying unit 26 (drying unit) that performs the drying process on the printing plate 12 and the substrate 14 following the laminating process; and a peeling unit 28 that peels off the substrate 14 from the printing plate 12 following the drying process by the post-drying unit 26.

In addition, although not illustrated, the printing apparatus 10 illustrates a substrate supply unit that supplies the substrate 14 to be printed and a substrate discharge unit that discharges the printed substrate 14 to outside the apparatus.

[Inking unit]

A so-called inkjet system is applied to the inking unit 20 illustrated in FIG. 1. More specifically, a liquid (ink) 31A is placed (supplied) inside the recessed portion (pattern portion) 12A of the printing plate 12 wound around an outer peripheral surface of the plate cylinder 16 (relative movement unit) using the inkjet system for ejecting the liquid from an inkjet head 30.

The printing plate 12 is an intaglio plate including the recessed portion 12A having the same shape as that of the pattern to be formed on the substrate. Examples of the material forming the printing plate 12 include resin, metal, glass, and the like.

When a brittle material such as glass is applied to the substrate 14, an elastic material is applied to the printing plate 12. For example, various kinds of elastomers such as fluorosilicone rubber, butyl rubber, ethylene-propylene rubber, nitrile rubber, neoprene rubber, hypalon rubber, and urethane rubber can be applied.

From the point of view of a good releasing property from the substrate 14, the printing plate 12 may be made of a material having liquid repellency such as silicone rubber made of a polymer such as polydimethylsiloxane (PDMS) and fluororubber. When the printing plate 12 is made of a material having a good releasing property (material having liquid repellency) from the substrate 14, the transferability of the liquid (micropattern) is improved and the liquid is prevented from remaining on the printing plate 12 following the transfer (following the peeling step), thus enabling continuous printing by omitting a step of cleaning the printing plate 12 following the peeling step.

Examples of the liquid for use in the present embodiment include a metal liquid (metal ink) prepared by dispersing metal particles in a solvent, a semiconductor liquid (semiconductor ink) prepared by dissolving a polymer semiconductor in a solvent, and the like.

The liquid for use in the present embodiment has a viscosity ($1 \times 10^{-3}$ Pa·s to $20 \times 10^{-3}$ Pa·s) capable of being ejected from the inkjet head 30, and may include a liquid whose solvent is evaporated by a drying process such as heating and air flow blowing, a liquid causing curing reaction by irradiation with actinic rays, and a liquid causing agglutination reaction by reaction with an aggregation treatment liquid.

Figure 2:
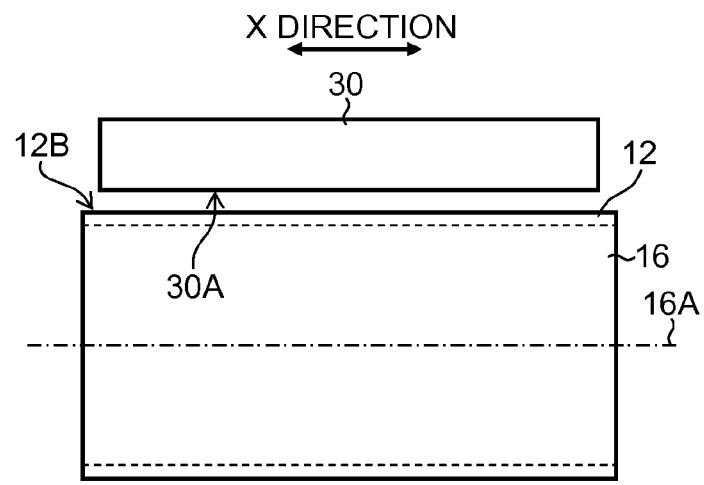
FIG. 2 is a schematic configuration view of an inking unit of the printing apparatus illustrated in FIG. 1.

FIG. 2 is a schematic configuration view of the inking unit 20. As illustrated in the figure, the inkjet head 30 is disposed in an upper portion of the printing plate 12, and a predetermined distance is maintained between a liquid ejection surface 30A of the inkjet head 30 and a surface 12B (a surface in which the recessed portion 12A (see FIG. 1) is formed) of the printing plate 12.

The inkjet head 30 is a full-line type head having a length corresponding to an entire length (entire width of the substrate 14) in a direction (hereinafter may be referred to as an "X direction") parallel to the printing plate 12, that is, a direction parallel to a rotation shaft 16A of a plate cylinder 16. The inkjet head 30 is placed in a position in which a constant clearance is maintained between the liquid ejection surface (nozzle surface) 30A and a surface 12B of the printing plate 12.

Figure 3A:
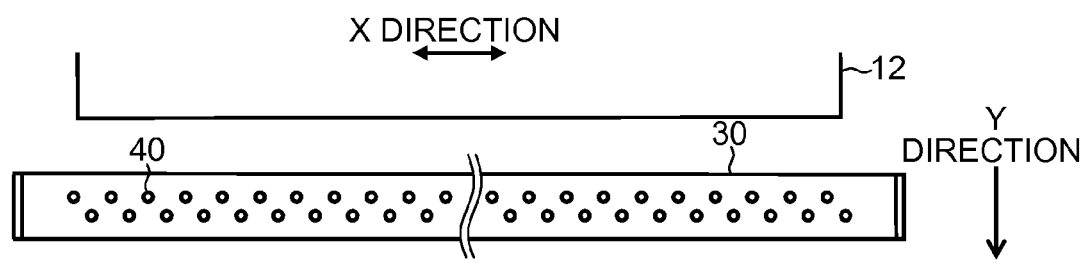
FIG. 3A is a plan view illustrating a nozzle arrangement of an inkjet head illustrated in FIG. 2.

FIG. 3A is a plan view illustrating an arrangement of nozzles 40 provided in the inkjet head 30. As illustrated in the figure, the liquid ejection surface 30A of the inkjet head 30 has the nozzles (nozzle openings) 40 formed therein to eject liquid.

The inkjet head 30 illustrated in FIG. 3A has the nozzles 40 in plural provided at regular intervals in the X direction over a length corresponding to the entire width of the printing plate 12.

The inkjet head 30 illustrated in FIG. 3A has two rows of nozzles in the Y direction (moving direction of the printing plate 12) perpendicular to the X direction and the plurality of nozzles 40 are arranged in a staggered manner.

As illustrated in FIG. 3A, the staggered arrangement of the nozzles in two rows allows the nozzles 40 to be arranged at high density. Note that the nozzles 40 can be arranged in three or more rows. The arrangement of the nozzles 40 in three or more rows allows the nozzles 40 to be arranged at higher density.

Specifically, the nozzle array applicable to the present invention is not limited to a staggered arrangement of two rows, but may have a structure having a single nozzle row in the Y direction or may have a structure having a plurality of nozzles 40 arranged in matrix.

Figure 3B:
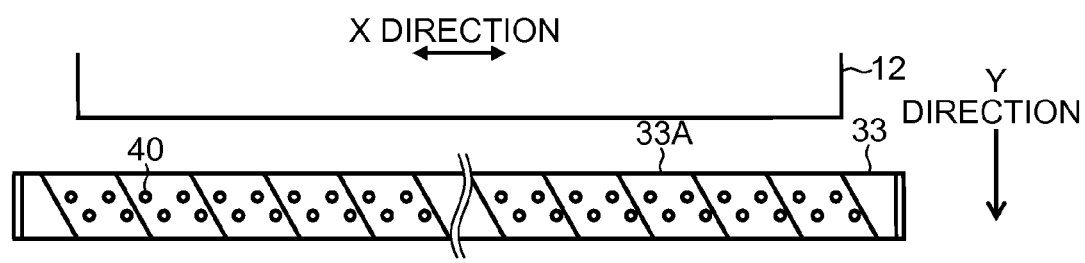
FIG. 3B is a plan view illustrating another structure example of the inkjet head.

FIG. 3B is a plan view illustrating another structure example of the inkjet head. The inkjet head 33 illustrated in FIG. 3B has a structure having a plurality of head modules (head assemblies) 33A joined together in the X direction over the length corresponding to the entire width of the printing plate 12.

FIG. 3B illustrates a configuration of joining the head modules 33A in plural in a row, but the plurality of head modules 33A may be configured to be joined together in a staggered manner.

The inkjet head 30 may be formed by a piezoelectric system for ejecting liquid using flexural deformation, shear deformation, longitudinal vibration, and the like of a piezoelectric element, or may be formed by various methods such as a thermal system using a film boiling phenomenon to eject liquid and an electrostatic system using an electrostatic force.

The inking unit 20 having such a structure places (fills) a predetermined amount (volume) of liquid inside the recessed portion 12A formed in the printing plate 12 by ejecting liquid while relatively moving the inkjet head 30 and the printing plate 12 in the Y direction.

Note that the structure of the inkjet head 30 (33) is not limited to the structure illustrated in FIGS. 3A and 3B. For example, the inkjet head 30 (33) may be formed by a serial system in which the inkjet head having a plurality of nozzles arranged at a predetermined arrangement interval in the Y direction is moved in the X direction over the entire length of the substrate 14 to eject liquid in the X direction, and when one liquid ejection in the X direction ends, the substrate 14 is moved by a predetermined amount in the Y direction to eject liquid in the X direction over a next region, whereby the series of operations is repeated to place liquid over the entire surface of the substrate 14 (entire surface of the region on which the liquid is placed).

[Pre-Drying Unit]

Referring back to FIG. 1, the pre-drying unit 22 illustrated in the figure is arranged on a subsequent stage side (downstream side in the moving direction of the printing plate 12) of the inking unit 20. The pre-drying unit 22 performs a drying process (pre-drying process) on a liquid 31B placed inside the recessed portion 12A of the printing plate 12 to remove part of the solvent.

The drying process by the pre-drying unit 22 may be either natural drying or forced drying. The term "natural drying" refers to a process of evaporating the solvent of the liquid 31B placed inside the recessed portion 12A of the printing plate 12 without performing a forced drying process such as air blowing or heating.

Meanwhile, the term "forced drying" refers to a process of evaporating a solvent component of the liquid 31B placed inside the recessed portion 12A of the printing plate 12 by promoting evaporation of the solvent by a forced drying process such as air blowing and heating.

Examples of air blowing include air blowing by air blowing means such as a fan. Examples of heating include heating by an infrared heater and heating by irradiation with high frequency or microwave. Alternatively, warm air (hot air) may be blown by a combination of air blowing and heating.

Note that the drying process by the pre-drying unit 22 assumes that the liquid 31B placed inside the recessed portion 12A of the printing plate 12 is not completely dried, but in a state of fluidity.

[Laminating Unit]

The laminating unit 24 is arranged on a subsequent stage side of the pre-drying unit 22. The laminating unit 24 laminates the surface 12B of the printing plate 12 on a pattern forming surface 14A of the substrate 14 by aligning the printing plate 12 subjected to the drying process by the pre-drying unit 22 with the substrate 14 supplied from an not illustrated substrate supply unit.

The position of the printing plate 12 can be obtained from a signal outputted from an encoder attached to the rotation shaft of the plate cylinder 16. In addition, the position of the substrate 14 can be obtained from a signal outputted from an encoder (illustrated by a reference numeral 144 in FIG. 4) attached to a drive system (motor) of a transport unit (not illustrated) for transporting the substrate 14.

A position sensor for detecting a starting end position of the printing plate 12 and a position sensor for detecting a leading end position of the substrate 14 may be provided. Then, the positions of the printing plate 12 and the substrate 14 may be obtained using the signals detected by those position sensors.

[Post-Drying Unit]

A post-drying unit 26 is arranged on a subsequent stage side of the laminating unit 24. The post-drying unit 26 may perform natural drying or forced drying in the same manner as the pre-drying unit 22. From the point of view of reduction in processing time, air blowing, heating, and a combination of these are preferable.

The drying process by the post-drying unit 26 prevents the liquid inside the recessed portion 12A of the printing plate 12 from being completely dried and further reduces the fluidity of the liquid.

In the case of using aqueous liquid (metal liquid, metal (nano) ink) containing metal particles forming electrical wiring patterns and in the case of using semiconductor liquid (semiconductor ink) prepared by dissolving polymer semiconductors in the solvent, the solvent component (mainly water) is evaporated by blowing dry air or warm (hot) air.

In the case of using a liquid (actinic ray curable ink) cured by irradiation with actinic rays such as ultraviolet rays, an actinic ray emitting means (ultraviolet light source) is provided in the post-drying unit 26.

Note that the drying process by the post-drying unit 26 will be described in detail later.

[Peeling Unit]

A peeling unit 28 is arranged on a subsequent stage side of the post-drying unit 26. The peeling unit 28 peels off the substrate 14 from the printing plate 12 following the drying process by the post-drying unit 26. Specific examples of the peeling process by the peeling unit 28 include a peeling process using a peeling claw (not illustrated), a peeling process using an absorption sheet (not illustrated), and other peeling processes.

As another embodiment, the peeling unit 28 may include a fixing means for fixing the substrate 14 so as to peel off the substrate 14 from the printing plate 12 by moving the printing plate 12 in a state in which the substrate 14 is fixed.

Following the peeling process by the peeling unit 28, the substrate 14 is transported on a transport cylinder 17. Meanwhile, the printing plate 12 has a certain releasing property from the liquid, which eliminates the need to be subjected to a cleaning process for each printing, and thus enables continuous printing.

[Description of Control System]

Figure 4:
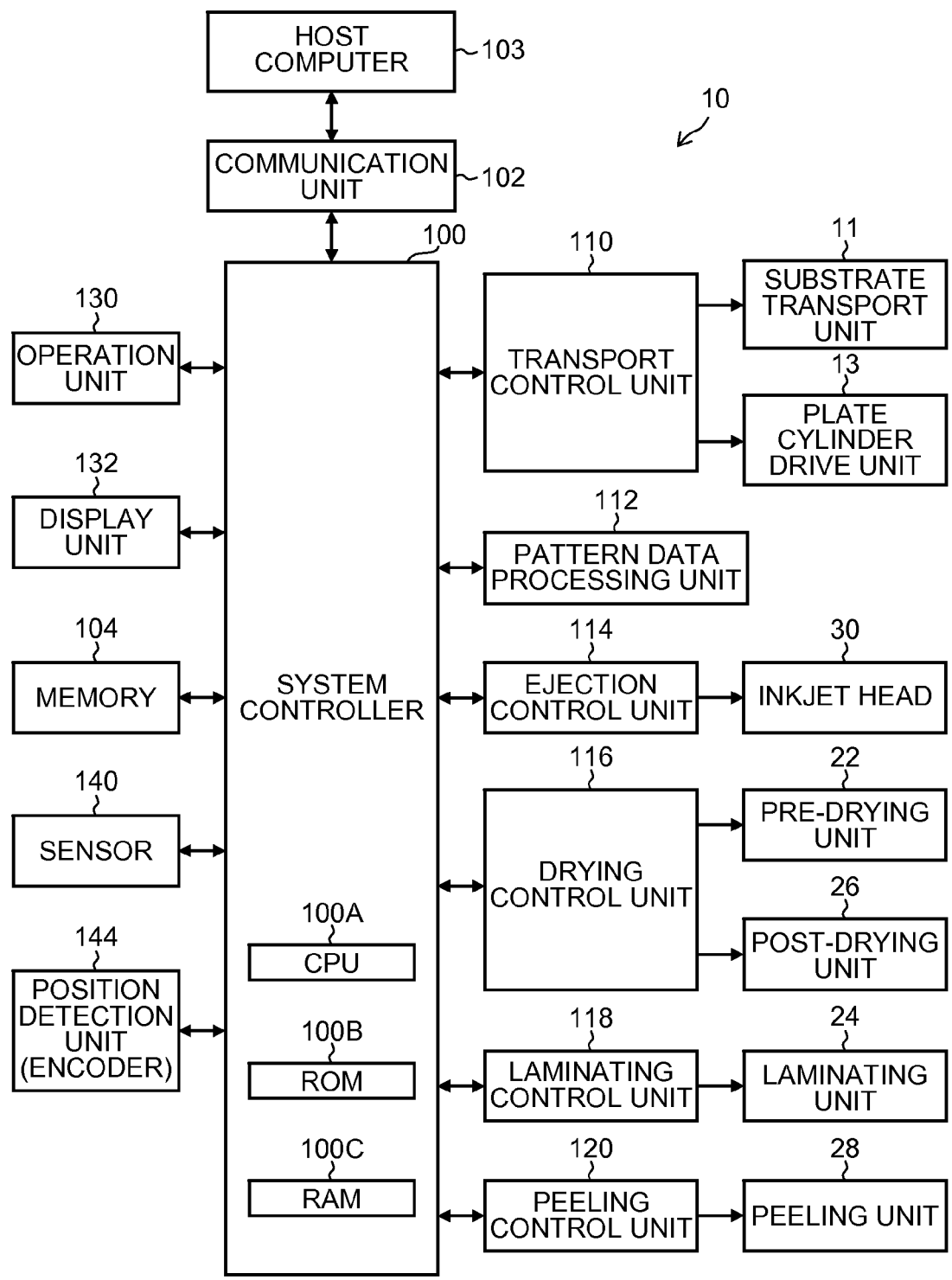
FIG. 4 is a block diagram illustrating a schematic configuration of a control system of the printing apparatus illustrated in FIG. 1.

FIG. 4 is a block diagram illustrating a schematic configuration of a control system of the printing apparatus 10.

As illustrated in the figure, the printing apparatus 10 includes a system controller 100, a communication unit 102, a memory 104, a transport control unit 110, a pattern data processing unit 112, an ejection control unit 114, a drying control unit 116, a laminating control unit 118, a peeling control unit 120, an operation unit 130, a display unit 132, a sensor 140, a position detection unit 144 (encoder), and the like.

The system controller 100 functions as control means for performing overall control on each unit of the printing apparatus 10, and functions as calculation means for performing various calculation processes. The system controller 100 includes a central processing unit (CPU) 100A, a read only memory (ROM) 100B, and a random access memory (RAM) 100C therein.

The system controller 100 also functions as a memory controller for controlling writing data to the ROM 100B, RAM 100C, and a memory which is not illustrated, and reading data from those memories.

FIG. 4 illustrates an embodiment in which the memories such as the ROM 100B and the RAM 100C are stored in the system controller 100, but the memories such as the ROM 100B and the RAM 100C may be provided outside the system controller 100.

The communication unit 102 includes a required communication interface to transmit and receive data to and from a host computer 103 connected to the communication interface.

The memory 104 functions as a temporary memory for storing various data including pattern data. The data is read from and written to the memory 104 through the system controller 100. The pattern data received from the host computer through the communication unit 102 is temporarily stored in the memory 104.

The transport control unit 110 controls the operation of a substrate transport unit 11 and a plate cylinder drive unit 13 for rotating the plate cylinder 16 (see FIG. 1) in the printing apparatus 10.

The substrate transport unit 11 includes a transport mechanism for transporting the substrate 14 from the substrate supply unit (not illustrated) to the substrate discharge unit (not illustrated), a drive unit for driving the transport mechanism, and a support unit (not illustrated) for supporting the substrate 14 during transport. In addition, the plate cylinder drive unit 13 includes a drive source such as a motor of the plate cylinder 16 and a drive mechanism such as gears.

The pattern data processing unit 112 generates ejection data (dot data) of the inkjet head 30 based on the pattern data (data including position information, width information, and other information about the recessed portion 12A formed in the printing plate 12) transmitted from the host computer 103.

In other words, the pattern data processing unit 112 is a processing unit for performing a process similar to that of an image processing unit (processing unit for generating dot data from raster data) in an inkjet recording device.

The ejection data generated by the pattern data processing unit 112 is sent to the ejection control unit (head driver) 114. The ejection data sent to the ejection control unit 114 is converted to a drive voltage to be supplied to the inkjet head 30 and applied to a pressure generating element of the inkjet head 30.

More specifically, based on the ejection data generated by the pattern data processing unit 112, a liquid ejection rate and a liquid ejection timing of the inkjet head 30 are controlled. According to the liquid ejection rate and the liquid ejection timing of the inkjet head 30, the transport control unit 110 controls the relative movement speed (start and stop moving the printing plate 12) between the inkjet head 30 and the printing plate 12.

As used herein, the term "pressure generating element" refers to a piezoelectric element (piezoelectric actuator) in a piezoelectric system, a heater in a thermal system, and means for applying an ejection pressure to the liquid of the inkjet head 30.

The drying control unit 116 controls the operation of the pre-drying unit 22 and the post-drying unit 26 according to a command from the system controller 100. More specifically, the drying control unit 116 controls the drying temperature, the flow rate of dry gas, the injection timing of dry gas, and the like, for the drying process of the pre-drying unit 22 and the post-drying unit 26.

The laminating control unit 118 controls the operation of the laminating unit 24. More specifically, based on position information about the substrate 14 obtained from the sensor 140 (position detection sensor for detecting the position of the substrate 14) and position information about the printing plate 12 obtained from the position detection unit (encoder) 144, the laminating control unit 118 transmits a command signal to the transport control unit 110 through the system controller 100.

In response to the command signal, the transport control unit 110 controls the operation of the substrate transport unit 11 and controls the operation of the plate cylinder drive unit 13 for rotating the plate cylinder 16.

In addition, the laminating control unit 118 controls the operation of an adjustment mechanism (not illustrated) for adjusting the distance interval between the printing plate 12 and the substrate 14 so as to cause the substrate 14 and the printing plate 12 to be in close contact with each other.

The peeling control unit 120 controls the operation of the peeling unit 28 according to a command from the system controller 100. In an embodiment in which a peeling claw is applied to the peeling unit 28, when the printing plate 12 and the substrate 14 reach a predetermined peeling position, the peeling control unit 120 operates the peeling claw to peel off the substrate 14 from the printing plate 12.

The operation unit 130 includes operation members (operation means) such as operation buttons, a keyboard, a touch panel, and the like. The operation unit 130 transmits operation information inputted from the operation members to the system controller 100. The system controller 100 performs various processes according to the operation information transmitted from the operation unit 130.

The display unit 132 includes a display device such as an LCD panel. The display unit 132 causes the display device to display various device settings information, error information, and other information thereon according to a command from the system controller 100.

FIG. 4 illustrates a sensor 140 on behalf of various sensors. The sensor 140 in FIG. 4 includes a temperature sensor provided in the pre-drying unit 22 for detecting a temperature of the printing plate 12, a temperature sensor provided in the post-drying unit 26 for detecting a temperature of the printing plate 12 or the substrate 14, a scum detection sensor for detecting a scam of the printing plate 12 following the peeling of the substrate 14 (prior to the inking process), an image sensor for detecting a pattern formed (transferred) in the substrate 14, and other sensors.

[Description of Printing Method]

Figure 5A:
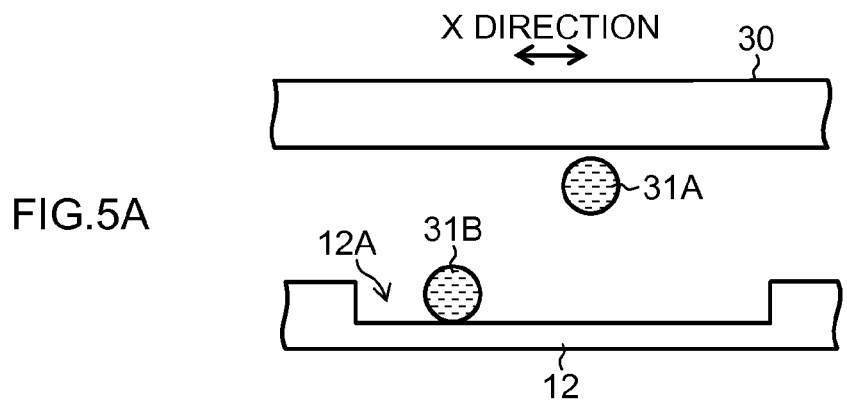
FIG. 5A is an explanatory drawing of an inking step.
Figure 5B:
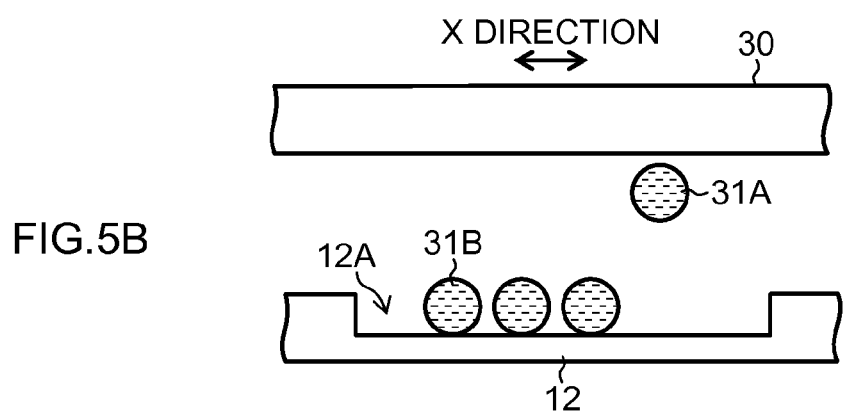
FIG. 5B is another explanatory drawing of the inking step.

The description will now focus on the printing method (micropattern forming method) using the printing apparatus 10. FIGS. 5A and 5B are an explanatory drawing schematically illustrating the inking step. Note that in the following description, the same or similar components as or to the previously described components are designated by the same reference numerals or characters, and the description thereof is omitted.

<Inking Step>

The inking step illustrated in FIGS. 5A and 5B causes the inking unit 20 (see FIG. 1) to eject the liquid 31A from the inkjet head 30 so as to be landed inside the recessed portion 12A formed in the printing plate 12. The liquid landed inside the recessed portion 12A is designated by reference alphanumeric code 31B.

As illustrated in FIGS. 5A and 5B, the inking step performs, a plurality of times, a relative movement (relative movement process) between the full-line type inkjet head 30 and the printing plate 12 so as to place a predetermined volume of the liquid 31B in a predetermined position.

FIGS. 5A and 5B schematically illustrate an embodiment of the inking step of placing the liquid 31B into the recessed portion 12A by performing twice the relative movement between the inkjet head 30 and the printing plate 12.

FIG. 5A schematically illustrates a first round of liquid deposition. In the first round of liquid deposition, the liquid 31B is placed in every other position in a predetermined deposition position of the liquid 31B.

FIG. 5B schematically illustrates a second round of liquid deposition. In the second round of liquid deposition, the liquid 31B is placed in an intermediate position of the liquid 31B placed in the first round of liquid deposition.

Figure 5C:
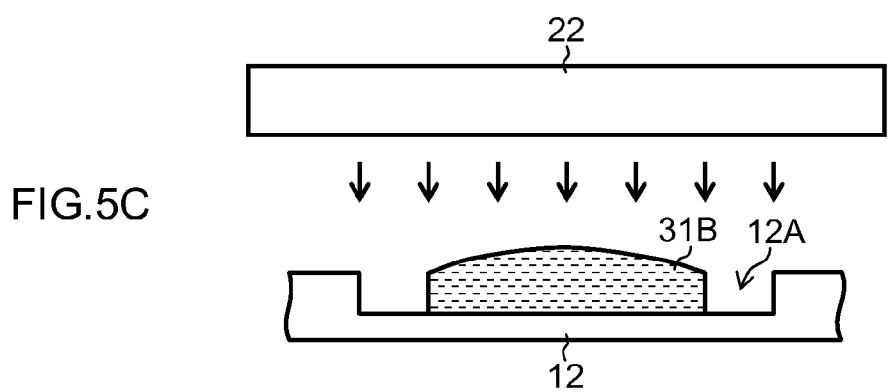
FIG. 5C is an explanatory drawing of a pre-drying step.

As described above, in the second round of relative movement between the inkjet head 30 and the printing plate 12, the liquid 31B landed inside the recessed portion 12A is coalesced with an adjacent liquid 31B to form a coalesced body of liquid 31B inside the recessed portion 12A (see FIG. 5C). The interior of the recessed portion 12A has liquid repellency (the detail will be described later), which prevents the liquid (coalesced liquid) 31B from spreading wet in the entire recessed portion 12A, resulting in a gap between the liquid 31B and an inner wall of the recessed portion 12A.

Note that the device configuration in which the liquid 31B is placed in all liquid deposition positions by performing, a plurality of times, the relative movement between the inkjet head 30 and the printing plate 12 will be described in detail later.

Examples of liquid droplet deposition method in the inking step may include a system in which the liquid 31B is placed in all liquid deposition positions by performing only once the relative movement between the inkjet head 30 and the printing plate 12.

In the embodiment illustrated in FIGS. 5A and 5B, the liquid 31B inside the recessed portion 12A is arranged in discrete (isolated) droplets. As used herein, the term "discrete (isolated) arrangement" of the liquid 31B refers to an arrangement in which when a liquid is landed, the liquid does not contact an adjacent liquid, and in the embodiment illustrated in FIGS. 5A and 5B, the diameter of the liquid 31B when landed is less than the arrangement pitch of the liquid 31B.

The liquid 31B immediately after landed, does not contact the adjacent liquid 31B, but when a certain period of time has elapsed since the liquid 31B was landed, the liquid 31B spreads, resulting in that the adjacent liquid droplets contact with each other to form a coalesced droplet.

Note that the total volume (total volume of the liquid placed inside the recessed portion 12A) of the liquid 31B (31A) is greater than the total volume of the recessed portion 12A. In other words, the liquid 31B having a volume greater than the total volume (total capacity) of the recessed portion 12A to the extent that the liquid 31B does not overflow from the recessed portion 12A is placed inside the recessed portion 12A (see FIG. 5C).

The total ejection volume of the liquid 31B (31A) may be appropriately determined according to the physical properties (viscosity and the like) of the liquid. The amount of ejection in one ejection is obtained by dividing the total ejection volume by the number of landed positions.

<Pre-Drying Step>

The inking step is followed by a pre-drying step to be performed by the pre-drying unit 22. FIG. 5C is an explanatory drawing schematically illustrating the pre-drying step.

The pre-drying step performs a drying process (pre-drying process) on the liquid 31B placed inside the recessed portion 12A of the printing plate 12 to remove part of the solvent component. In FIG. 5C, the arrow lines directed from the pre-drying unit 22 toward the liquid 31B (printing plate 12) represents air and heat imparted to the liquid 31B.

The liquid 31B inside the recessed portion 12A prior to the pre-drying process has a viscosity to the extent that the liquid 31B can be ejected from the inkjet head, and hence the liquid 31B flows inside the recessed portion 12A.

In light of this, the pre-drying process removes part of the solvent of the liquid 31B inside the recessed portion 12A thereby to increase the viscosity of the liquid 31B to be higher than the viscosity when landed (ejected) and to have a fluid state to the extent that the viscosity does not inhibit planarization of the liquid 31B.

In addition, the volume of the liquid 31B inside the recessed portion 12A is adjusted to be suitable for leveling in a later described laminating step.

The processing conditions (air volume, air pressure, heating temperature, processing time, etc.) for the pre-drying process are appropriately determined according to the physical properties of the liquid to be used. For example, in the case of using a liquid having a relatively higher viscosity when landed, the processing time is relatively shorter, and the air volume and the air pressure are relatively smaller. In addition, the heating temperature is relatively lower.

Meanwhile, in the case of using a liquid having a relatively lower viscosity when landed, the processing time is relatively longer, and the air volume and the air pressure are relatively larger. In addition, the heating temperature is relatively higher.

<Laminating Step>

Figure 5D:
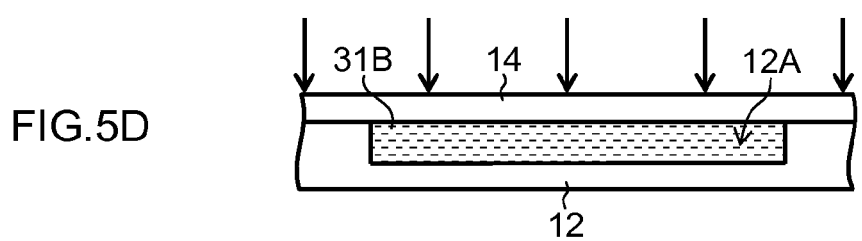
FIG. 5D is an explanatory drawing of a laminating step.

The pre-drying step is followed by a laminating step to be performed by the laminating unit 24 (see FIG. 1). FIG. 5D is an explanatory drawing schematically illustrating the laminating step.

As illustrated in the figure, the printing plate 12 is aligned with the substrate 14 and the substrate 14 is laminated on the printing plate 12. When the substrate 14 is laminated on the printing plate 12, the substrate 14 is pressed against the printing plate 12, whereby the liquid 31B inside the recessed portion 12A of the printing plate 12 is planarized (leveled).

The arrow lines illustrated in FIG. 5D represent a pressing force directed from the substrate 14 toward the printing plate 12. Laminating the substrate 14 on the printing plate 12 causes the liquid 31B inside the recessed portion 12A of the printing plate 12 to flows, resulting in that the liquid 31B spreads out inside the recessed portion 12A.

In the case of using a film substrate (substrate having bendable flexibility) as illustrated in FIG. 1, the substrate 14 can be laminated on the printing plate 12 by winding the substrate 14 around the plate cylinder 16 around whose outer peripheral surface the printing plate 12 is wound.

At this time, the printing plate 12 can be pressed against the plate cylinder 16 by winding the substrate 14 around the plate cylinder 16 while pulling the substrate 14 in a direction opposite to the plate cylinder 16.

Meanwhile, in the case of using a rigid substrate (substrate using a hard material) such as a glass substrate and a glass epoxy substrate, the printing plate 12 is made in planar contact with the substrate 14 by overlapping the substrate 14 on the planarly supported printing plate 12.

<Post-Drying Step>

Figure 6A:
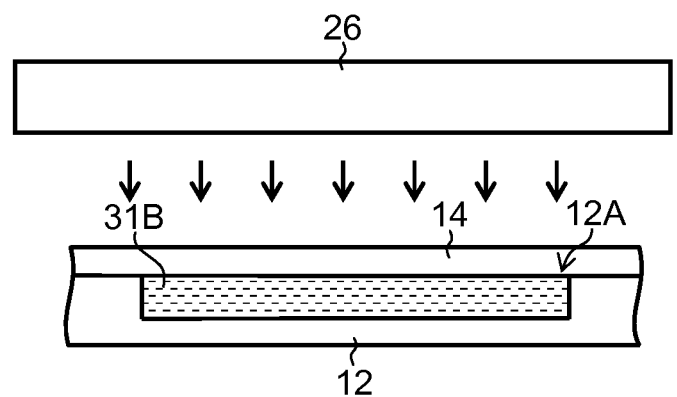
FIG. 6A is an explanatory drawing of a post-drying step.

The laminating step is followed by a post-drying step to be performed by the post-drying unit 26. FIG. 6A is an explanatory drawing schematically illustrating the post-drying step.

The liquid 31B inside the recessed portion 12A (following the pre-drying process) in the aforementioned laminating step has a fluidity to the extent that the liquid 31B can move inside the recessed portion 12A. Thus, if the substrate 14 is peeled off from the printing plate 12 as is, the liquid 31A will flow, which cannot maintain the shape of the recessed portion 12A of the printing plate 12.

In light of this, the post-drying process illustrated in the figure performs a drying process on the liquid 31B placed inside the recessed portion 12A of the printing plate 12 thereby to further reduce the fluidity of the liquid 31B.

Note that the post-drying process assumes that when the substrate 14 is peeled off from the printing plate 12 in the peeling step (see FIG. 6B) without completely drying the liquid 31B inside the recessed portion 12A, a pattern 31C (the liquid 31B following the post-drying process, see FIG. 6B) has a fluidity to the extent that the pattern 31C does not remain inside the recessed portion 12A.

The liquid 31B following the post-drying process has a fluidity to the extent that the liquid 31B does not move inside the recessed portion 12A, has less fluidity than when the substrate 14 is laminated on the printing plate 12, and is cured to the extent that the liquid 31B does not remain inside the recessed portion 12A.

Performing the drying process on the liquid 31B inside the recessed portion 12A in this manner causes the liquid 31B in the same shape as that of the recessed portion 12A to be formed in the substrate 14, and further prevents the liquid 31B (pattern 31C) from remaining inside the recessed portion 12A.

In the state in which the printing plate 12 is in close contact with the substrate 14 in the post-drying step, the solvent component of the liquid 31B passes through the interface between the printing plate 12 and the substrate 14, and the solvent component of the liquid 31B passes through the substrate 14, whereby the solvent component of the liquid 31B is escaped from inside the recessed portion 12A to the outside.

<Peeling Step>

Figure 6B:
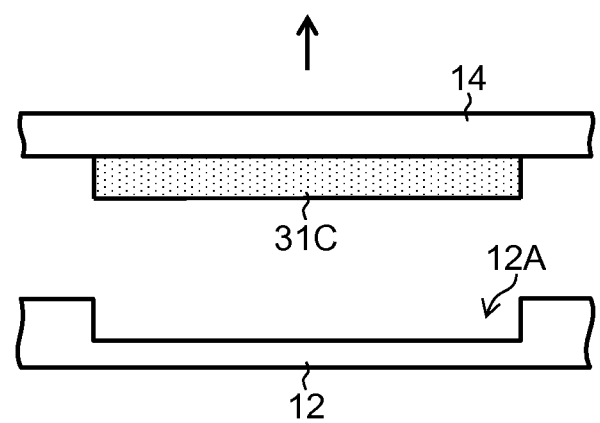
FIG. 6B is an explanatory drawing of a peeling step.

FIG. 6B is an explanatory drawing schematically illustrating the peeling step to be performed by the peeling unit 28. As illustrated in the figure, following the post-drying step, the substrate 14 is peeled off from the printing plate 12, and then the liquid (pattern) 31C that has been placed inside the recessed portion 12A of the printing plate 12, subjected to the pre-drying process, the leveling, and the post-drying process, and then cured is transferred to the substrate 14.

The arrow line illustrated in FIG. 6B represents a pressure imparted to the substrate 14 in the peeling step.

The pattern 31C transferred to the substrate 14 has a shape such that the shape of the recessed portion 12A of the printing plate 12 is faithfully reproduced. In addition, the liquid 31B (see FIG. 6A) does not remain inside the recessed portion 12A of the printing plate 12.

[Detailed Description of Printing Plate]

Figure 7:
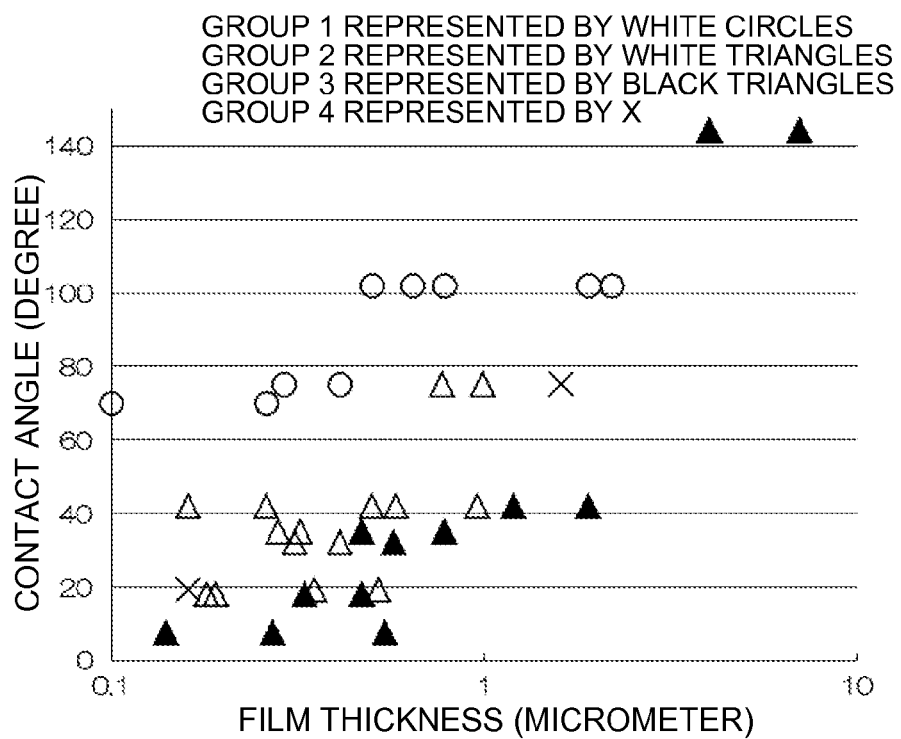
FIG. 7 is an explanatory drawing of an ink film thickness and an ink contact angle.
Figure 7:
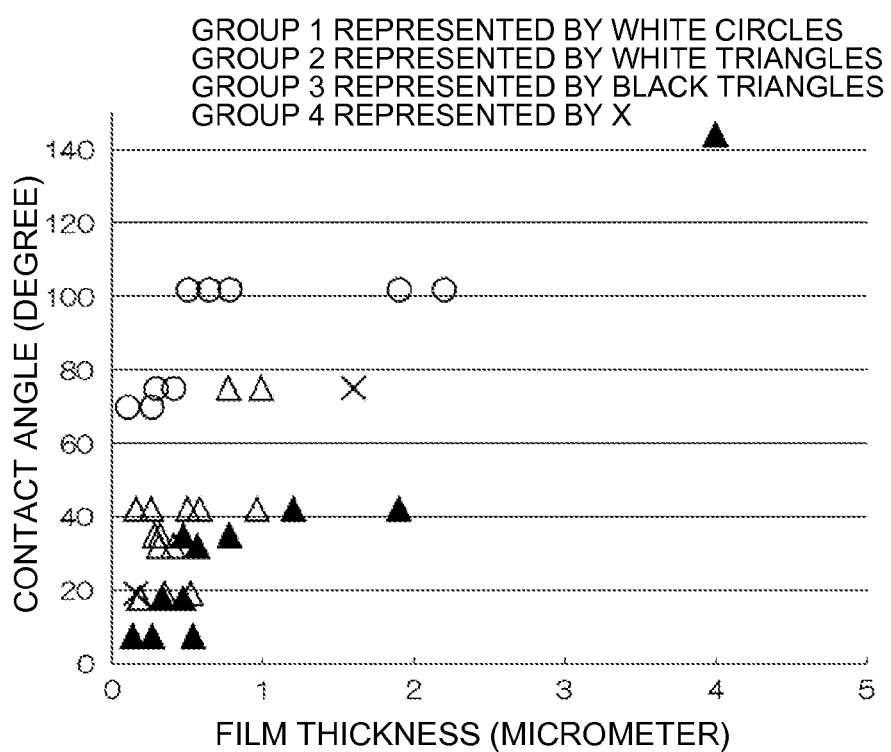

The printing plate 12 will now be described in detail. From the point of view of ensuring releasability from liquid 31B, the recessed portion 12A of the printing plate 12 has liquid repellency to the liquid to be used. The portion (a) of FIG. 7 is an explanatory drawing illustrating a relationship between the film thickness (micrometer) of the liquid 31B inside the recessed portion 12A of the printing plate 12 and the contact angle (degree) inside the recessed portion 12A of the printing plate 12 to the liquid 31B to be used. The portion (b) of FIG. 7 is an enlarged portion (a) with the horizontal line representing real numbers.

As used herein, the film thicknesses of the liquid 31B were measured following the post-drying process using a Confocal Microscope OPTELICS (registered trademark) series H1200 (product name, manufactured by Laser Tech Co., Ltd.).

The group 1 (represented by white circles) in the figure represents cases in each of which a good pattern 31C (see FIG. 6B) was formed with no liquid 31B remaining inside the recessed portion 12A. In other words, when the film thickness of the liquid 31B is relatively thin and the contact angle is relatively high, a good pattern having the reproduced shape of the recessed portion 12A is formed (transferred).

The good pattern was formed under the conditions where when the film thicknesses of the liquid 31B are 0.1 micrometers and 0.26 micrometers, the contact angle inside the recessed portion 12A is 70° (degrees); when the film thicknesses of the liquid 31B are 0.29 micrometers and 0.41 micrometers, the contact angle inside the recessed portion 12A is 75°; and when the film thicknesses of the liquid 31B is 0.5 micrometers, 0.64 micrometers, 0.78 micrometers, 1.9 micrometers, and 2.2 micrometers, the contact angle inside the recessed portion 12A is 102°.

In other words, under the conditions where when the film thicknesses of the liquid 31B placed inside the recessed portion 12A of the printing plate 12 following the post-drying step is equal to or greater than 0.5 micrometers and equal to or less than 3.0 micrometers, the contact angle inside the recessed portion 12A of the printing plate 12 is equal to or greater than 100°, a good pattern 31C is formed in the substrate 14 with no liquid 31B remaining inside the recessed portion 12A.

Note that a more preferable upper limit of the film thickness is 2.2 micrometers according to the experimental measurement data, but considering that the contact angle is constant (102°) when the film thickness is in the range from 0.5 micrometers to 2.2 micrometers, the contact angle can be assumed to be constant when the film thickness is in the range of 2.2 micrometers plus several micrometers. Therefore, the preferable upper limit of the film thickness is set to 3.0 micrometers.

Likewise, a more preferable lower limit of the film thickness is 0.5 micrometers according to the experimental measurement data. Considering the trend of data from 0.5 micrometers to 0.41 micrometers and considering that it is difficult to accurately adjust the film thickness up to two decimal places, the more preferable lower limit of the film thickness is set to 0.5 micrometers.

Note also that a more preferable minimum value of the contact angle is 102° according to the experimental measurement data, but considering that it is difficult to accurately adjust the contact angle up to two decimal places, and considering measurement errors and the like, the preferable minimum value of the contact angle is set to 100°.

In addition, when the film thickness of the liquid 31B is less than 0.5 micrometers, the contact angle inside the recessed portion 12A is made equal to or greater than 70°. Under this condition, a good pattern 31C with no liquid 31B remaining inside the recessed portion 12A is formed in the substrate 14 (see FIG. 6B).

Note that a preferable lower limit of the film thickness is 0.1 micrometer according to the experimental measurement data, which is not different from data with a film thickness of 0.26 micrometers. In consideration of this trend, the similar data is assumed to be obtained with a film thickness of 0.1 micrometer or less.

In addition, considering the trend of data from 0.5 micrometers to 0.41 micrometers and considering that it is difficult to accurately adjust the film thickness up to two decimal places, the preferable film thickness range is set to 0.5 micrometers or less.

Meanwhile, group 2 (represented by white triangles) represents cases with remaining liquid, where the pattern 31C maintained the width of the recessed portion 12A, but did not maintain the depth of the recessed portion 12A (insufficient thickness).

In addition, group 3 (represented by black triangles) represents cases with remaining liquid, where the pattern 31C did not maintain the width of the recessed portion 12A (insufficient width) and did not maintain the depth of the recessed portion 12A (insufficient thickness).

Finally, group 4 (represented by X) represents cases in each of which the pattern 31C was not formed in the substrate 14 (part of the liquid 31B inside the recessed portion 12A was moved into substrate 14, but the pattern 31C was not formed).

The relationship between the film thickness (micrometer) of the liquid 31B inside the recessed portion 12A of the printing plate 12 and the contact angle (degree) inside the recessed portion 12A of the printing plate 12 illustrated in FIG. 7 was derived using the following liquid (nano silver ink).

Liquid 1: Solvent-based silver nanoink L-Ag1TeH (model number) (manufactured by ULVAC, Inc.)

Liquid 1A: Solvent-based silver nanoink (ink prepared by adjusting the silver concentration of L-Ag1TeH (model number) for the purpose of film thickness adjustment)

Liquid 2: Solvent-based silver nanoink TR65880 (model number) (manufactured by Taiyo Ink Mfg Co., Ltd.)

Liquid 3: Water-based silver nanoink SW 1020 (model number) (manufactured by Bando Chemical Industries, Ltd.)

In addition, the printing plate was made of the following materials.

Printing plate 1: Two liquid type of polydimethylsiloxane (PDMS) X-32-3279-A and X-32-3279-B (model number) (manufactured by Shin-Etsu Chemical Co., Ltd.)

Printing plate 2: Surface modified by irradiating printing plate 1 with vacuum-ultraviolet light (a wavelength of 172 nm)

Printing plate 3: Liquid photosensitive resin APR G-11 (model number) (manufactured by Asahi Kasei E-Materials Corporation.)

Printing plate 4: Liquid photosensitive resin APR M-20 (model number) (manufactured by Asahi Kasei E-Materials Corporation.)

Printing plate 5: Liquid photosensitive resin APR K-11 (model number) (manufactured by Asahi Kasei E-Materials Corporation.)

Note that the relative relationship of the plate hardness of the printing plates 3 to 5 is such that the plate hardness of the printing plate 5 is greater than the plate hardness of the printing plate 3 which is greater than the plate hardness of the printing plate 4.

The substrate was made of the following materials.

Substrate (film): Polyethylene naphthalate film Q65FA (model number) (manufactured by Teijin Limited.)

Drying was performed under the conditions where both pre-drying and post-drying were performed, the pre-drying was performed for 1 minute to 20 minutes, the post-drying was performed for 5 seconds to 10 minutes, and both pre-drying and post-drying were performed at room temperature.

The data of groups 1 to 4 illustrated in FIG. 7 was measured under the conditions listed in Tables 1 to 4 respectively. Table 1 lists data of group 1. Table 2 lists data of group 2. Table 3 lists data of group 3. Table 4 lists data of group 4.

TABLE 1

| Film thickness (micrometer) | Contact angle (°) | Liquid | Plate |
|---|---|---|---|
| 0.1 | 70 | 1A | 2 |
| 0.26 | 70 | 1A | 2 |
| 0.29 | 75 | 2 | 1 |
| 0.41 | 75 | 2 | 1 |
| 0.5 | 102 | 1 | 1 |
| 0.64 | 102 | 1 | 1 |
| 0.78 | 102 | 1 | 1 |
| 1.9 | 102 | 1 | 1 |
| 2.2 | 102 | 1 | 1 |

TABLE 2

| Film thickness (micrometer) | Contact angle (°) | Liquid | Plate |
|---|---|---|---|
| 0.16 | 42 | 2 | 1 |
| 0.18 | 18 | 2 | 3 |
| 0.19 | 18 | 2 | 3 |

TABLE 2-continued

| Film thickness (micrometer) | Contact angle (°) | Liquid | Plate |
|---|---|---|---|
| 0.26 | 42 | 2 | 5 |
| 0.28 | 35 | 2 | 4 |
| 0.31 | 32 | 2 | 2 |
| 0.32 | 35 | 2 | 4 |
| 0.35 | 19 | 3 | 3 |
| 0.41 | 32 | 2 | 2 |
| 0.5 | 42 | 2 | 5 |
| 0.52 | 19 | 3 | 3 |
| 0.58 | 42 | 3 | 4 |
| 0.77 | 75 | 2 | 1 |
| 0.96 | 42 | 2 | 5 |
| 0.99 | 75 | 2 | 1 |

TABLE 3

| Film thickness (micrometer) | Contact angle (°) | Liquid | Plate |
|---|---|---|---|
| 0.14 | 7.5 | 3 | 1 |
| 0.27 | 7.5 | 3 | 2 |
| 0.33 | 18 | 2 | 3 |
| 0.47 | 18 | 2 | 3 |
| 0.47 | 35 | 2 | 4 |
| 0.54 | 7.5 | 3 | 2 |
| 0.57 | 32 | 2 | 2 |
| 0.78 | 35 | 2 | 4 |
| 1.2 | 42 | 3 | 4 |
| 1.9 | 42 | 3 | 4 |
| 4 | 144 | 3 | 5 |
| 7 | 144 | 3 | 1 |
| 7 | 144 | 3 | 5 |
| 11 | 144 | 3 | 1 |
| 11 | 144 | 3 | 5 |

TABLE 4

| Film thickness (micrometer) | Contact angle (°) | Liquid | Plate |
|---|---|---|---|
| 0.16 | 19 | 3 | 3 |
| 1.6 | 75 | 2 | 1 |

[Other Device Configurations]

Figure 8:
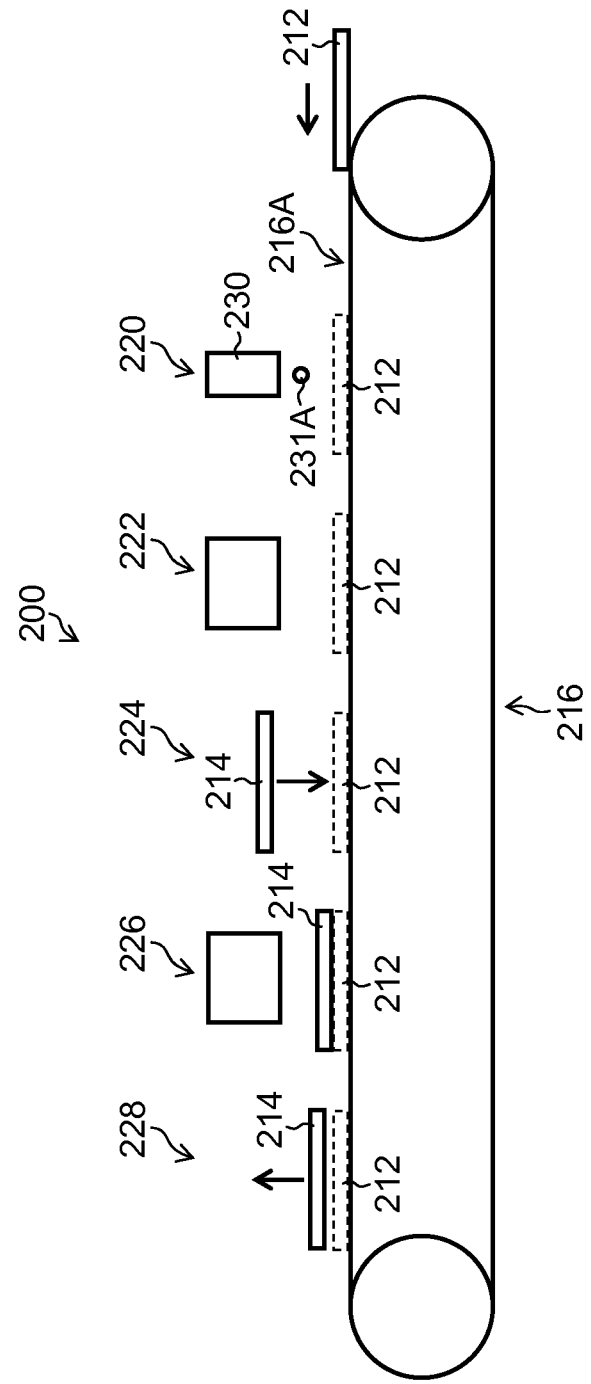
FIG. 8 is an entire configuration view illustrating another device configuration.

FIG. 8 is an entire configuration view illustrating another device configuration of the printing apparatus according to the present invention. A printing apparatus 200 illustrated in the figure transports a printing plate 212 on a flat surface 216A of a printing plate transport unit 216 (relative movement unit), in the course of which an inking unit 220, a pre-drying unit 222, a laminating unit 224, a post-drying unit 226, and a peeling unit 228 perform the respective processes.

In FIG. 8, a substrate 214 supplied to the printing plate transport unit 216 is illustrated by solid lines; and the printing plate 212 used by the inking unit 220, the pre-drying unit 222, the laminating unit 224, the post-drying unit 226, and the peeling unit 228 are illustrated by broken lines.

The embodiment of planarly transporting a printing plate 212 illustrated in FIG. 8 is effective for the substrate 214 made of a brittle material (rigid materials, or stiff, inflexible materials weak to bending) such as a glass substrate.

Instead of the printing plate transport unit 216 illustrated in FIG. 8, another embodiment may be used in which each processing unit has its own individual printing plate transport unit and transfer unit for transferring the printing plate 212 between the processing units.

The processes of the inking unit 220, the pre-drying unit 222, the laminating unit 224, the post-drying unit 226, and the peeling unit 228 illustrated in FIG. 8 are the same as the processes of the inking unit 20, the pre-drying unit 22, the laminating unit 24, the post-drying unit 26, and the peeling unit 28 illustrated in FIG. 1, and hence the description thereof is omitted.

Note that in FIG. 8, reference numeral 230 designates an inkjet head for ejecting a liquid 231A. Note also that the arrow lines illustrated in FIG. 8 indicate the direction of transporting the printing plate 212.

In the present embodiment, the printing plate 12 (212) is moved with respect to each unit, but as another embodiment, the printing plate 12 (212) may be fixed and each unit may be moved. Alternatively, as still another embodiment, the printing plate 12(212) may be moved by means (such as an XY table) for two-dimensionally moving the printing plate 12(212).

[Description of Inkjet Head Liquid Ejection Method]

Figure 9A:
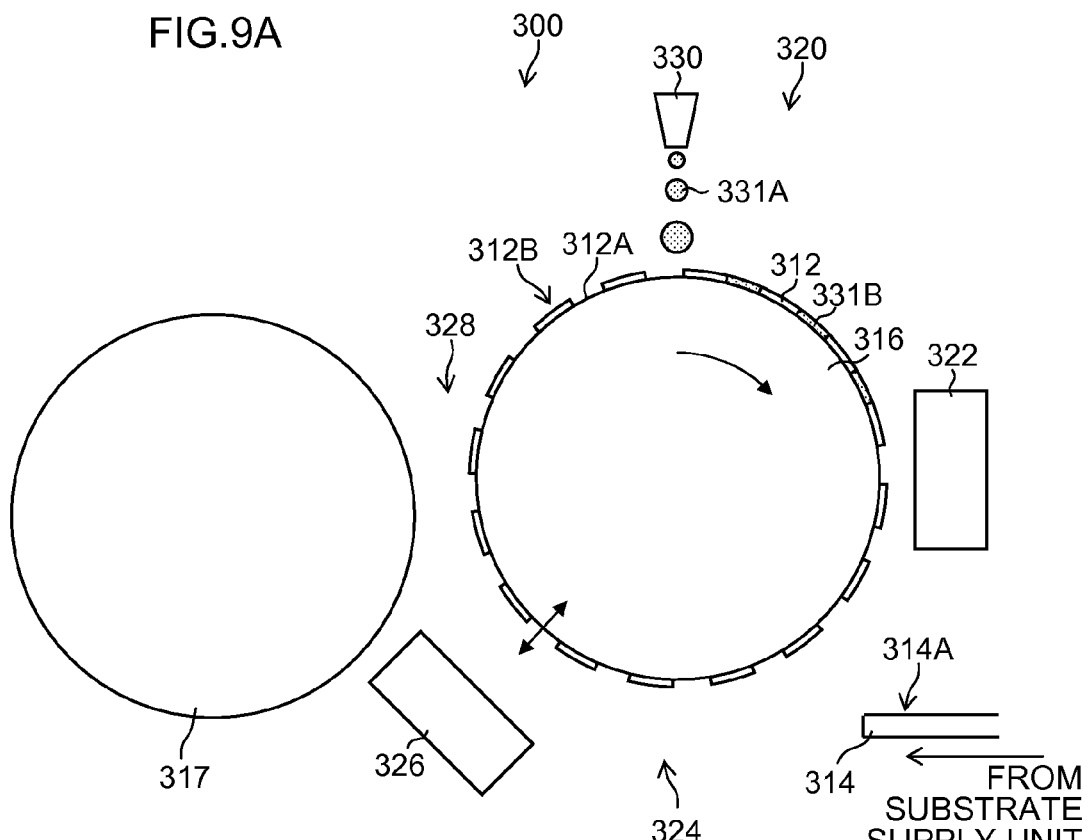
FIG. 9A is a view illustrating a state of the inking step in the entire configuration view of a device preferable for interlaced droplet ejection.
Figure 9B:
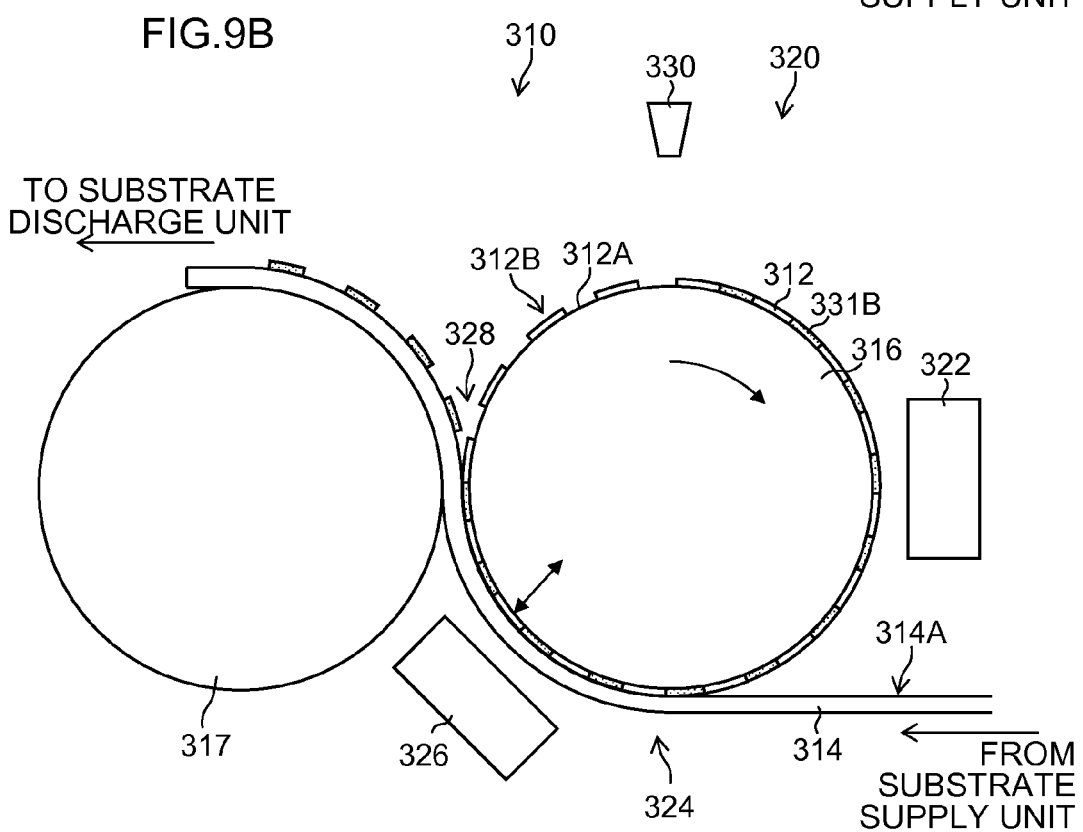
FIG. 9B is a view illustrating a state following the laminating step in the entire configuration view of the device preferable for interlaced droplet ejection.

FIGS. 9A and 9B are an entire configuration view schematically illustrating a schematic device configuration preferable for interlaced droplet ejection to be described later. FIG. 9A illustrates the inking step. FIG. 9B illustrates the laminating step and the following steps. Note that most of the components illustrated in FIGS. 9A and 9B are the same as the components illustrated in FIG. 1. The reference numerals in FIGS. 9A and 9B start with "3" followed by the same two digits as those in FIG. 1. More specifically, a printing apparatus 300 is configured to include: an inking unit 320 that places ink into (performs an inking process on) a recessed portion 312A of a printing plate 312; a pre-drying unit 322 that performs a drying process on the printing plate 312 following the inking process; a laminating unit 324 that laminates a substrate 314 on the printing plate 312 following the pre-drying process; a post-drying unit 326 (drying unit) that performs a drying process on the printing plate 312 and the substrate 314 following the laminating process; and a peeling unit 328 that peels off the substrate 314 from the printing plate 312 following the drying process by the post-drying unit 326. In addition, in FIGS. 9A and 9B, reference alphanumeric code 312B designates a surface of the printing plate 312, reference alphanumeric code 314A designates a pattern forming surface of the substrate 314, and reference numeral 317 designates a transport cylinder, and reference alphanumeric code 331B designates liquid.

The printing apparatus 300 illustrated in FIGS. 9A and 9B is configured such that a plate cylinder 316 can be moved in a direction indicated by both arrow lines by a moving mechanism which is not illustrated. Specifically, when the substrate 314 is laminated on the printing plate 312 in the laminating step, the plate cylinder 316 is moved obliquely downward from the position in the inking step. FIG. 9B illustrates a state after the plate cylinder 316 has been moved in the laminating step.

In the inking step illustrated in FIG. 9A, an inkjet head 330 and the printing plate 312 are moved a plurality of times (the plate cylinder 316 is rotated a plurality of times immediately under the inkjet head 330), whereby a droplet is placed in all deposition positions of the liquid 331B determined according to the printing data.

While the plate cylinder 316 is being rotated a plurality of times, a predetermined distance (clearance) between the surface 312B of the plate cylinder 316 and the substrate 314 is maintained in order to prevent the printing plate 312 from contacting the substrate 314.

The interlace system is applied to droplet ejection (liquid deposition) in the inking step. More specifically, for a first round of droplet ejection from the inkjet head 330, the liquid 331B is placed in discrete (isolated) droplets on the printing plate 312, and for multiple rounds of droplet ejections, the liquid 331B is ejected (deposited) into a different position, whereby the droplets are placed in all deposition positions of the liquid 331B determined according to the printing data.

When the inking step ends, as illustrated in FIG. 9B, the position of the substrate 314 is aligned with the position of the printing plate 312 having the liquid deposited therein and the plate cylinder 316 is moved obliquely downward.

When the plate cylinder 316 is moved to the position where the printing plate 312 is pressed against the substrate 314, the liquid 331B on the printing plate 312 is transferred to the substrate 314.

FIGS. 10A to 10D are an explanatory drawing of an interlaced droplet ejection control (method) for the inking unit 20 (reference numeral 220 in FIG. 8). Note that in FIGS. 10A to 10D, liquid droplets placed adjacent to each other are in contact with each other, but the liquid deposition position and placement distance may be determined such that the liquid droplets placed adjacent to each other are partially overlapped.

In the interlaced droplet ejection control to be described later, a liquid (dot) is skippingly placed by one relative movement between the inkjet head 30 (reference numeral 230 in FIG. 8 and reference numeral 330 in FIGS. 9A and 9B) and the printing plate 12, whereby the liquid is placed in all deposition positions by multiple relative movements between the inkjet head and the printing plate 12.

Therefore, a landing time difference between the liquid droplets placed in adjacent deposition positions occurs, which suppresses landing position deviation due to landing interference (coalescence), prevents the liquid from leaking from inside the recessed portion 12A (reference alphanumeric code 312A in FIGS. 9A and 9B) of the printing plate 12 (reference numeral 212 in FIG. 8 and reference numeral 312 in FIGS. 9A and 9B), and prevents a space from occurring due to insufficient liquid.

FIGS. 10A to 10D illustrate cases in which a liquid (reference alphanumeric code 31B in FIG. 1 and reference alphanumeric code 331B in FIGS. 9A and 9B) is placed inside the recessed portion 12A of the printing plate 12 by four relative movements between the inkjet head 30 and the printing plate 12.

Figure 10A:
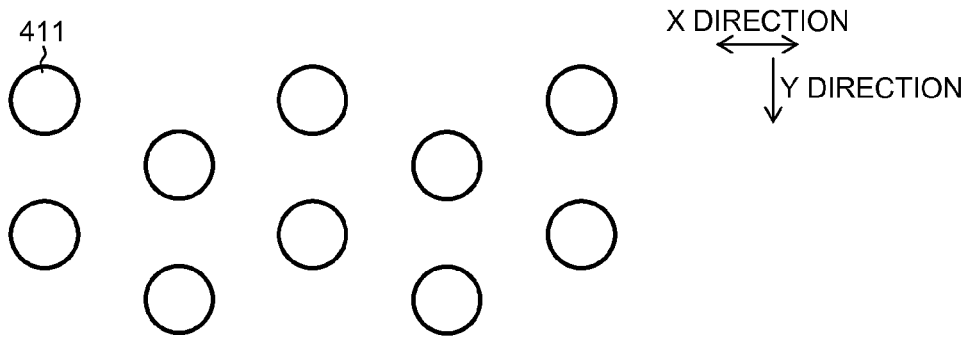
FIG. 10A is an explanatory drawing illustrating a liquid deposition following a first movement in interlaced droplet ejection.

FIG. 10A schematically illustrates a liquid 411 (reference alphanumeric code 31B in FIGS. 5A to 5D and reference alphanumeric code 331B in FIGS. 9A and 9B) placed inside the recessed portion 12A by a first round of relative movement (first round of liquid deposition). The liquid 411 is placed in every other position in a staggered manner in the X direction (width direction of the printing plate 12) and in the Y direction (moving direction of the printing plate 12).

Figure 10B:
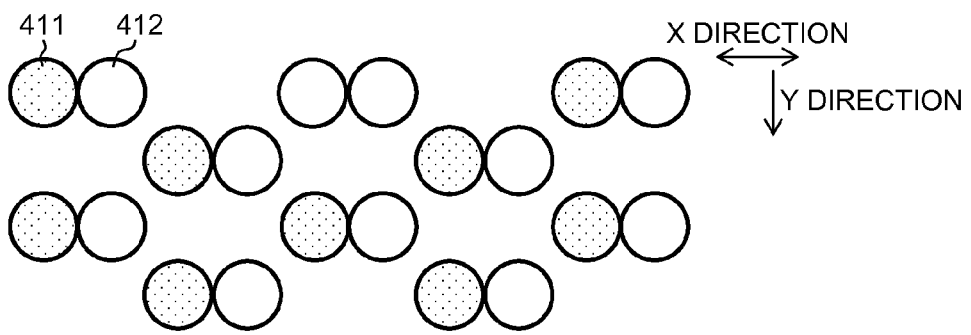
FIG. 10B is an explanatory drawing illustrating a liquid deposition following a second movement in interlaced droplet ejection.

FIG. 10B schematically illustrates the liquid 411 (illustrated by dot hatching) placed by the first round of liquid deposition and a liquid 412 placed inside the recessed portion 12A by a second round of relative movement (second round of liquid deposition).

The second round of liquid deposition causes the liquid 412 to be placed in an adjacent position (one of the adjacent positions in the X direction) in the X direction on the right hand side of the liquid 411 placed by the first round of liquid deposition in FIGS. 10A to 10D. Then, fixation of the liquid 411 placed by the first round of liquid deposition progresses, and hence coalescence occurs between the liquid 411 placed by the first round of liquid deposition and the liquid 412 placed by the second round of liquid deposition, but landing position deviation due to landing interference does not occur.

Figure 10C:
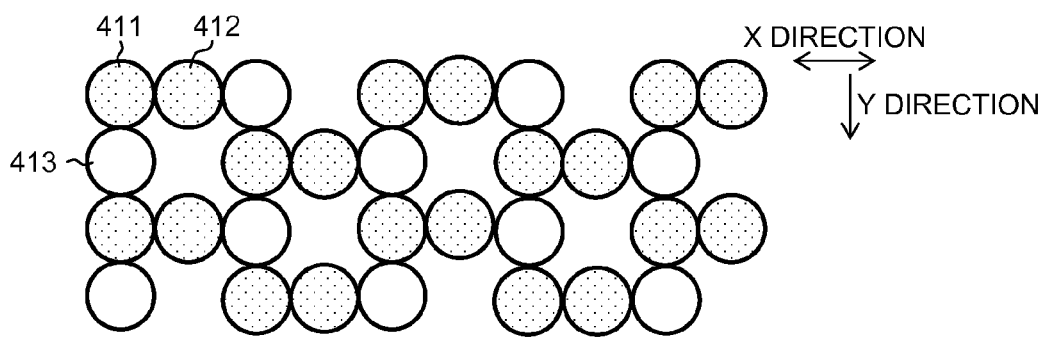
FIG. 10C is an explanatory drawing illustrating a liquid deposition following a third movement in interlaced droplet ejection.

FIG. 10C illustrates the liquid 411 (illustrated by dot hatching) placed by the first round of liquid deposition, the liquid 412 (illustrated by dot hatching) placed by the second round of liquid deposition, and a liquid 413 placed by a third relative movement (third round of liquid deposition).

The third round of liquid deposition causes the liquid 413 to be placed between the liquids 411 placed by the first round of liquid deposition in the Y direction. Then, fixation of the liquid 411 placed by the first deposition progresses, and hence coalescence occurs between the liquid 411 placed by the first round of liquid deposition and the liquid 413 placed by the third round of liquid deposition, but landing position deviation due to landing interference does not occur.

Figure 10D:
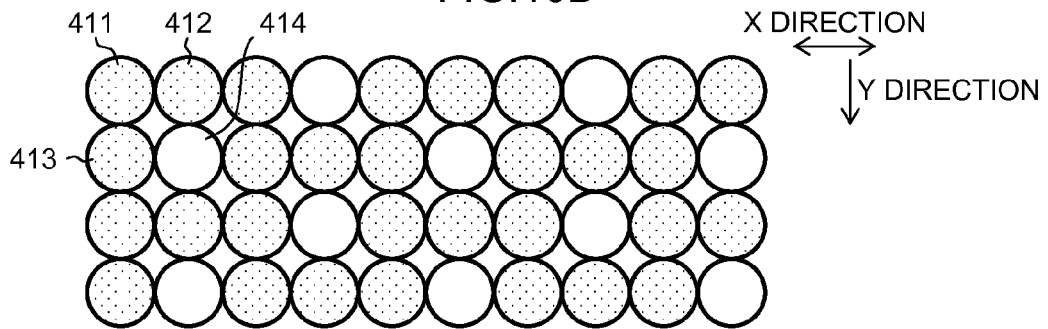
FIG. 10D is an explanatory drawing illustrating a liquid deposition following a fourth movement in interlaced droplet ejection.

FIG. 10D illustrates the liquid 411 (illustrated by dot hatching) placed by the first round of liquid deposition, the liquid 412 (illustrated by dot hatching) placed by the second round of liquid deposition, the liquid 413 (illustrated by dot hatching) placed by the third round of liquid deposition, and a liquid 414 placed by a fourth relative movement (fourth round of liquid deposition).

The fourth round of liquid deposition causes the liquid 414 is placed between the liquids 412 placed by the second round of liquid deposition in the Y direction. Then, fixation of the liquid 412 placed by the second round of liquid deposition progresses, and hence coalescence occurs between the liquid 412 placed by the second round of liquid deposition and the liquid 414 placed by the fourth round of liquid deposition, but landing position deviation due to landing interference does not occur.

Note that the interlace system described using FIGS. 10A to 10D is just an example, and hence the liquid deposition and the number of relative movements (number of liquid depositions) between the inkjet head 30 and the printing plate 12 may be appropriately determined as long as the liquids 411 to 414 are skippingly placed by one movement of the inkjet head 30.

Any modifications, additions, or deletions may be appropriately made to the above-described printing apparatus and printing method without departing from the spirit and scope of the present invention.

For example, the printing apparatus (printing method) may include a curing unit (hardening step) that performs a curing process on the substrate 14 (pattern 31C) following the peeling process, a detection unit (detection step) that detects the presence or absence of the liquid 31B remaining in the printing plate 12 (recessed portion 12A) following the peeling process, and a cleaning unit (cleaning step) that performs a cleaning process on the printing plate 12 (recessed portion 12A) following the detection process if the presence of the liquid 31B remaining in the printing plate 12 (recessed portion 12A) is detected.

Alternatively, the presence or absence of the liquid 31B remaining in the printing plate 12 (recessed portion 12A) may be determined based on the shape of the pattern 31C formed in the substrate 14.

[Invention to be Disclosed Herein]

As has become evident from the above detailed description of the embodiments of the invention, the present specification includes disclosure of various technical ideas including the invention as described in at least the following.

(First aspect) A printing apparatus including: a printing plate having a recessed portion formed therein shaped corresponding to a pattern to be formed on a substrate; an inking unit including an inkjet head that performs an inking process of ejecting a liquid into the recessed portion of the printing plate, the liquid having particles as a material of the pattern dispersed therein; a laminating unit that performs a laminating process of laminating the substrate on a surface having the recessed portion of the printing plate formed therein in a state in which the liquid is placed inside the recessed portion of the printing plate; a drying unit that performs a drying process on the liquid inside the recessed portion in a state in which the substrate is laminated on the surface having the recessed portion of the printing plate formed therein, thereby to reduce fluidity of the liquid; and a peeling unit that peels off the substrate from the printing plate following the drying process by the drying unit.

According to the first aspect, the liquid is placed inside the recessed portion of the printing plate by the inking unit, the substrate is laminated on the printing plate, the drying process is performed in the state in which the substrate is laminated on the printing plate, and the fluidity of the liquid inside the recessed portion of the printing plate is reduced to the extent that the shape of the liquid is maintained. Thus, after the substrate is peeled off from the printing plate, the fluidity of the liquid on the substrate is suppressed, and the shape of the liquid on the substrate corresponding to the shape of the recessed portion of the printing plate is maintained.

Therefore, it is possible to achieve a balance between preventing scumming (ink remaining on a planar portion) of the printing plate and ensuring reproducibility of the micropattern formed on the substrate.

(Second aspect) The printing apparatus according to the first aspect includes a pre-drying unit that performs a drying process on the liquid placed inside the recessed portion of the printing plate following the process by the inking unit prior to the process by the laminating unit, wherein the drying process reduces the volume of the liquid inside the recessed portion and reduces the fluidity of the liquid inside the recessed portion.

According to the second aspect, the liquid placed inside the recessed portion of the printing plate is dried before the substrate is laminated on the printing plate, and thereby the liquid volume is adjusted to the extent that the liquid does not overflow from inside the recessed portion due to liquid flow when the substrate is laminated on the printing plate and the liquid viscosity is also adjusted.

In addition, the pre-drying unit performs the pre-drying process, and thereby the time required for the subsequent drying step can also be shortened.

(Third aspect) In the printing apparatus according to the second aspect, the drying unit further reduces the fluidity of the liquid following the drying process by the pre-drying unit.

According to the third aspect, the liquid inside the recessed portion of the printing plate is dried in two steps, and thereby a preferable drying state of the liquid can be obtained at the laminating process by the laminating unit and at the peeling process by the peeling unit.

(Fourth aspect) In the printing apparatus according to any one of the first to third aspects, when the thickness of the liquid placed inside the recessed portion of the printing plate following the drying process is equal to or greater than 0.5 micrometers and equal to or less than 3.0 micrometers, the contact angle to the liquid to be used inside the recessed portion of the printing plate is equal to or greater than 100 degrees.

According to the fourth aspect, a good peeling between the recessed portion of the printing plate and the liquid is achieved, and a pattern faithfully reproducing the shape of the recessed portion of the printing plate is formed on the substrate.

(Fifth aspect) In the printing apparatus according to any one of the first to third aspects, when the thickness of the liquid placed inside the recessed portion of the printing plate following the drying process is less than 0.5 micrometers, the contact angle to the liquid to be used inside the recessed portion of the printing plate is equal to or greater than 70 degrees.

According to the fifth aspect, when the thickness of the liquid inside the recessed portion of the printing plate is relatively thin, the liquid repellency to the liquid to be used inside the recessed portion of the printing plate may be reduced.

(Sixth aspect) In the printing apparatus according to any one of the first to fifth aspects, the printing plate is made of silicone rubber or fluororubber.

According to the sixth aspect, the printing plate is made of a material having liquid repellency, and thereby the condition according to the fourth aspect or the fifth aspect can be satisfied.

(Seventh aspect) The printing apparatus according to any one of the first to sixth aspects includes: a relative movement unit that performs relative movement between the printing plate and the inkjet head; and an ejection control unit that controls liquid ejection of the inkjet head, wherein the ejection control unit discretely places the liquid into the recessed portion by one relative movement between the printing plate and the inkjet head by the relative movement unit, and places the liquid in all predetermined liquid deposition positions inside the recessed portion by multiple relative movements between the printing plate and the inkjet head by the relative movement unit.

According to the seventh aspect, the interlace system is applied to the inkjet head ejection control, and thereby liquid position deviation is prevented so as not to move the liquid placed in an adjacent position of the liquid inside the recessed portion.

(Eighth aspect) In the printing apparatus according to the seventh aspect, the inkjet head is a full-line type head having a length corresponding to an entire length in a direction perpendicular to the moving direction of the relative movement unit of the printing plate in a direction perpendicular to the moving direction of the relative movement unit.

In the eighth aspect, a preferable embodiment may be such that the liquid is discretely placed inside the recessed portion by ejecting the liquid for every several nozzles in a direction perpendicular to the moving direction of the relative movement unit.

(Ninth aspect) A printing method including: an inking step of performing an inking process of ejecting a liquid into a recessed portion of a printing plate using an inkjet head, the liquid having particles as a material of a pattern dispersed therein, the pattern to be formed on a substrate, the printing plate having the recessed portion shaped corresponding to the pattern formed on the substrate; a laminating step of performing a laminating process of laminating the substrate on a surface having the recessed portion of the printing plate formed therein in a state in which the liquid is placed inside the recessed portion of the printing plate following the inking step; a drying step of performing a drying process on the liquid inside the recessed portion following the laminating step in a state in which the substrate is laminated on the surface having the recessed portion of the printing plate formed therein, thereby to reduce fluidity of the liquid; and a peeling step of peeling off the substrate from the printing plate following the drying process by the drying step.

(Tenth aspect) It is included that a pre-drying step of performing a drying process on the liquid placed inside the recessed portion of the printing plate following the inking step and prior to the laminating step, wherein the drying process reduces the volume of the liquid inside the recessed portion and reduces the fluidity of the liquid inside the recessed portion.

(Eleventh aspect) In the printing method according to the tenth aspect, the drying step further reduces the fluidity of the liquid following the drying process by the pre-drying step.

(Twelfth aspect) In the printing method according to any one of the ninth to eleventh aspects, when the thickness of the liquid placed inside the recessed portion of the printing plate following the drying process is equal to or greater than 0.5 micrometers and equal to or less than 3.0 micrometers, the contact angle to the liquid to be used inside the recessed portion of the printing plate is equal to or greater than 100 degrees.

(Thirteenth aspect) In the printing method according to any one of the ninth to eleventh aspects, when the thickness of the liquid placed inside the recessed portion of the printing plate following the drying process is less than 0.5 micrometers, the contact angle to the liquid to be used inside the recessed portion of the printing plate is equal to or greater than 70 degrees.

(Fourteenth aspect) In the printing method according to any one of the ninth to thirteenth aspects, the printing plate is made of silicone rubber or fluororubber.

(Fifteenth aspect) The printing method according to any one of the ninth to fourteenth aspects, including a relative movement step of performing relative movement between the printing plate and the inkjet head, wherein the inking step discretely places the liquid into the recessed portion by one relative movement between the printing plate and the inkjet head, and places the liquid in all predetermined liquid deposition positions inside the recessed portion by multiple relative movements between the printing plate and the inkjet head.

In the above aspect, a preferable embodiment may use a full-line type inkjet head having a length corresponding to the entire length in a direction perpendicular to the moving direction of the relative movement unit of the printing plate in a direction perpendicular to the moving direction of the relative movement unit.

What is claimed is:

1. A printing apparatus comprising:
    a printing plate in which a recessed portion is formed, the recessed portion having a shape corresponding to a pattern to be formed on a substrate;
    an inking unit including an inkjet head that performs an inking process of ejecting a liquid into the recessed portion of the printing plate, the liquid having particles as a material of the pattern dispersed therein;
    a laminating unit that performs a laminating process of laminating the substrate on a surface having the recessed portion of the printing plate formed therein in a state in which the liquid is placed inside the recessed portion of the printing plate;
    a drying unit that performs a drying process on the liquid inside the recessed portion in a state in which the substrate is laminated on the recessed portion, thereby to reduce fluidity of the liquid; and
    a peeling unit that peels off the substrate from the printing plate after the drying process by the drying unit.

2. The printing apparatus according to claim 1, comprising a pre-drying unit that performs a drying process on the liquid placed inside the recessed portion of the printing plate after the process by the inking unit prior to the process by the laminating unit,
    wherein the drying process reduces the volume of the liquid inside the recessed portion and reduces the fluidity of the liquid inside the recessed portion.

3. The printing apparatus according to claim 2,
    wherein the drying unit further reduces the fluidity of the liquid after the drying process by the pre-drying unit.

4. The printing apparatus according to claim 1,
    wherein when the thickness of the liquid placed inside the recessed portion of the printing plate after the drying process is equal to or greater than 0.5 micrometers and equal to or less than 3.0 micrometers, the contact angle to the liquid to be used inside the recessed portion of the printing plate is equal to or greater than 100 degrees.

5. The printing apparatus according to claim 1,
    wherein when the thickness of the liquid placed inside the recessed portion of the printing plate after the drying process is less than 0.5 micrometers, the contact angle to the liquid to be used inside the recessed portion of the printing plate is equal to or greater than 70 degrees.

6. The printing apparatus according to claim 1,
    wherein the printing plate is made of silicone rubber or fluororubber.

7. The printing apparatus according to claim 1, comprising:
    a relative movement unit that performs relative movement between the printing plate and the inkjet head; and
    an ejection control unit that controls liquid ejection of the inkjet head,
    wherein the ejection control unit discretely places the liquid into the recessed portion by one relative movement between the printing plate and the inkjet head by the relative movement unit, and
    the liquid is placed in all predetermined liquid deposition positions inside the recessed portion by multiple relative movements between the printing plate and the inkjet head by the relative movement unit.

8. The printing apparatus according to claim 7,
    wherein the inkjet head is a full-line type head having a length corresponding to an entire length in a direction perpendicular to the moving direction of the relative movement unit of the printing plate in a direction perpendicular to the moving direction of the relative movement unit.

9. A printing method comprising:
    an inking step of performing an inking process of ejecting a liquid into a recessed portion of a printing plate using an inkjet head, the liquid having particles as a material of a pattern dispersed therein, the pattern to be formed on a substrate, the printing plate having the recessed portion shaped corresponding to the pattern formed on the substrate;
    a laminating step of performing a laminating process of laminating the substrate on a surface having the recessed portion of the printing plate formed therein in a state in which the liquid is placed inside the recessed portion of the printing plate after the inking step;
    a drying step of using a drying unit for performing a drying process on the liquid inside the recessed portion after the laminating step in a state in which the substrate is laminated on the recessed portion, thereby to reduce fluidity of the liquid; and
    a peeling step of peeling off the substrate from the printing plate after the drying process by the drying step.

10. The printing method according to claim 9, comprising a pre-drying step of performing a drying process on the liquid placed inside the recessed portion of the printing plate after the inking step and prior to the laminating step, wherein in the drying process, a volume of the liquid inside the recessed portion is reduced and fluidity of the liquid inside the recessed portion is reduced.

11. The printing method according to claim 10, wherein in the drying step, the fluidity of the liquid after the drying process by the pre-drying step is reduced.

12. The printing method according to claim 9, wherein when the thickness of the liquid placed inside the recessed portion of the printing plate after the drying process is equal to or greater than 0.5 micrometers and equal to or less than 3.0 micrometers, the contact angle to the liquid to be used inside the recessed portion of the printing plate is equal to or greater than 100 degrees.

13. The printing method according to claim 9, wherein when the thickness of the liquid placed inside the recessed portion of the printing plate after the drying process is less than 0.5 micrometers, a contact angle to the liquid to be used inside the recessed portion of the printing plate is equal to or greater than 70 degrees.

14. The printing method according to claim 9, wherein the printing plate is made of silicone rubber or fluororubber.

15. The printing method according to claim 9, comprising a relative movement step of performing relative movement between the printing plate and the inkjet head, wherein the inking step discretely places the liquid into the recessed portion by one relative movement between the printing plate and the inkjet head, and the liquid is placed in all predetermined liquid deposition positions inside the recessed portion by multiple relative movements between the printing plate and the inkjet head.

* * * * *